United States Patent [19]

Nakajima

[11] Patent Number: 5,355,239

[45] Date of Patent: Oct. 11, 1994

[54] COHERENT DETECTION TRANSCEIVER

[75] Inventor: Hisao Nakajima, Bagneux, France

[73] Assignee: France Telecom Etablissement Autonome De Droit Public, Paris, France

[21] Appl. No.: 32,662

[22] Filed: Mar. 17, 1993

[30] Foreign Application Priority Data

Mar. 20, 1992 [FR] France .................. 92 03382

[51] Int. Cl.5 .................. H04B 10/00; H04B 10/24
[52] U.S. Cl. .................. 359/152; 359/113; 359/130; 372/96
[58] Field of Search .................. 359/113–114, 359/124, 130, 143, 152, 173, 179, 183; 372/96

[56] References Cited

U.S. PATENT DOCUMENTS

| | | | |
|---|---|---|---|
| 4,908,833 | 3/1990 | Chraplyvy et al. | 359/173 |
| 4,972,514 | 11/1990 | Linke | 359/114 |
| 5,020,153 | 5/1991 | Choa et al. | 372/96 |
| 5,031,188 | 7/1991 | Koch et al. | 359/124 |
| 5,111,475 | 5/1992 | Ackerman et al. | 372/96 |

FOREIGN PATENT DOCUMENTS

| | | |
|---|---|---|
| 0420742 | 4/1991 | European Pat. Off. . |
| 2151402 | 7/1985 | Fed. Rep. of Germany ........ 372/96 |
| 2662883 | 12/1991 | France . |

OTHER PUBLICATIONS

Patent Abstracts of Japan, vol. 13, No. 476, (E-837), Oct. 10, 1989, JP-A-11 87 889, Jul. 27, 1989, K. Uomi, et al., "Distributed Feedback Type Semiconductor Laser".

Patent Abstracts of Japan, vol. 15, No. 470, (E-1139) 1991, JP-A-32 03 268, Sep. 4, 1991 Y. Hirayama, "Coherent Light Receiver".

Primary Examiner—Herbert Goldstein
Assistant Examiner—Kinfe-Michael Negash
Attorney, Agent, or Firm—Oblon, Spivak, McClelland, Maier & Neustadt

[57] ABSTRACT

A coherent detection transceiver comprises a stack of semiconductor layers with an active layer (12) and a grating (16) having a phase shifter (18). An electrode (30) is placed above the phase shifter in order to tap a voltage. This voltage is processed in a heterodyne circuit (36) in order to restore the modulation of the light beam introduced into the active layer.

10 Claims, 4 Drawing Sheets

COHERENT DETECTION TRANSCEIVER

BACKGROUND OF THE INVENTION

Technical Field

The present invention relates to a coherent detection transceiver and a bidirectional optical link using such a transceiver. The invention is used in optical telecommunications.

Description of the Background

Coherent detection receivers require a local oscillator, an optical mixer and a quadratic photodetector (generally a photodiode). This optical part of the receiver is completed by electronic circuits ensuring the recovery of the original signals.

Efforts have been made for a number of years to integrate the three optical components on a common substrate. Reference can be made in this connection to the article by H. TAKEUCHI et al entitled "Monolithic integrated coherent receiver on InP substrate", published in IEEE Photon. Tech. Lett., 1, pp. 398–400, 1989 and the article by T. L. KOCH et al entitled "Balanced operation of a GaInAs/GaInAsP multiple-quantum well integrated heterodyne receiver", published in IEEE Photon. Tech. Lett., 2, pp. 577–580, 1990.

Integrated devices of this type known as photonic integrated circuits or PIC's have made it possible to increase the reliability, compactness and simplicity of optical telecommunications installations. However, they still have a separate transmitter and receiver, even though these components are integrated on the same structure. It would be advantageous to only use a single component serving both as a local oscillator and receiver. This is proposed by R. F. KAZARINOV et al in an article entitled "Heterodyne reception of light by an injection laser", published in Sov. Phys. JETP., 39, pp. 522–527, 1974.

In a single apparatus of this type detection takes place the time variation of the carrier density due to the beat of the signal injected into the active layer of the laser with the light of said laser (which is used as the local oscillator). For this purpose the voltage variation at the laser terminals is measured. This principle was tested by carrying out a coherent reception in ASK or Amplitude Shift Keying in a BRAGG Reflector Laser (DBR) having Multiple Quantum Wells (MQW). This is described in the article by R. A. LINKE et al entitled "Self-oscillating optical mixer receiver", published in OFC'89, paper WN4, 1989. A sensitivity of $-36.6$ dBm was obtained at 400 Mb/s with a transmitter constituted by an external cavity laser and an external modular.

However, these known methods still suffer from disadvantages. Thus, although the photon integration method is the simplest as regards concept, it is very difficult to put into effect from the technical standpoint. The extra costs resulting from this complexity makes this procedure not appropriate for commercial systems. Although the idea of detecting the modulation of carriers caused by a beat in a DBR laser is attractive, the voltage variation is limited and requires a very high electrical gain (exceeding 60 dB).

DESCRIPTION OF THE INVENTION

The present invention aims at obviating these disadvantages. To this end, it proposes a single semiconductor structure, which is very simple to put into effect and which leads to an improved sensitivity. For an injected optical power of approximately $-35$ dBm, a signal 15 dB above the noise level was measured. The apparatus also has small overall dimensions ($0.1 \times 0.1 \times 0.6$ mm$^3$).

These results were obtained with a transceiver comprising a semiconductor structure with an active layer, distributed feedback (DFB) and a $\lambda/4$ phase shifter, which has a central electrode positioned above the phase shifter and two lateral electrodes supplied with current above the threshold. This apparatus behaves both like a local oscillator (functioning at a frequency Fo) and as a photoreceiver with respect to an optical signal received, which is at a frequency Fi. The variation between Fi and Fo must exceed the locking band in order to ensure that the photoreceiver is not tuned on the incident frequency. There are then simultaneously three signals at three different frequencies Fo, Fo+dF, Fo−dF (with dF=Fi−Fo). The signals at frequencies Fo+dF and Fo−dF are amplified by a four wave mixing process. By tapping the voltage appearing on the central electrode and processing it as in heterodyne detection, detection takes place of the beat of these frequencies, which is a sine function of the variation dF, which restores the information used for modulating the incident optical signal.

This heterodyne detection has a better sensitivity than in the case of a photodiode, which would receive an incident optical signal and a wave from a local laser. This sensitivity increase is due on the one hand to the fact that in the phase shifter DFB structure, the optical power is concentrated in the area of the phase shifter where the voltage tapping electrode is located and on the other hand is due to the fact that there is an optical amplification as a result of the four wave mixing.

The apparatus according to the invention is able to operate in frequency (FSK), amplitude (ASK) or phase (PSK) shift keying.

The invention also relates to a bidirectional optional link using two transceivers as described hereinbefore.

DETAILED DESCRIPTION OF THE EMBODIMENTS

Figure 1:
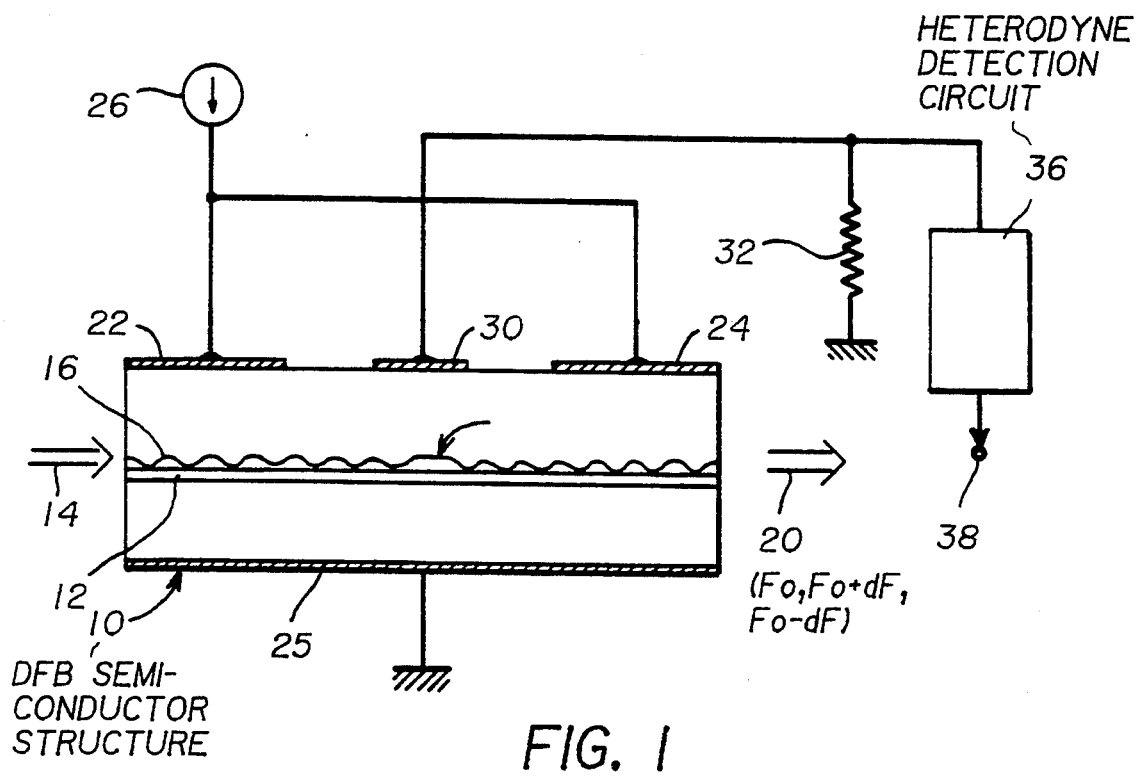
FIG. 1 illustrates a transceiver according to the invention.

The transceiver shown in FIG. 1 comprises a distributed feedback (DFB) semiconductor structure 10 constituted by a stack of layers, including an active layer 12 receiving an optical beam 14 at the frequency Fi. The structure also comprises a diffraction grating 16 optically coupled to the active layer 12. This grating 16 has a central region 18 introducing an optical phase shift.

The means for tapping the voltage at the terminals of this structure are constituted by a central electrode 30 placed above the central region 18 of the grating introducing an optical phase shift.

In addition, two lateral electrodes 22, 24 are positioned on either side of the central electrode 30 and are electrically insulated therefrom. These two electrodes 22, 24 are connected in parallel to a power supply 26, which supplies the structure above the laser threshold. Naturally, it would also be possible to separately supply these two electrodes. An electrode 25 is also placed beneath the structure and is e.g. connected to earth or ground. The tapping electrode 30 is connected to a resistor 32 and to a heterodyne detection circuit 36. The output connection 38 constitutes the receiver output.

Being supplied above the laser threshold, the semiconductor structure behaves like a transmitter laser. This laser has a natural frequency Fo. As stated, the frequency Fi of the incident optical signal 14 must be outside the locking range. In said range, the oscillation of the laser would be forced to the frequency of the incident signal, which would not be appropriate. Thus, in the present invention, it is wished to work in coherent detection and it is therefore essential for the local laser to be formed with its natural frequency. Therefore, it is necessary to supply the structure above the threshold and to ensure that the variation dF between the frequency Fi of the incident signal and the natural frequency Fo of the laser is sufficient to prevent locking.

Figure 2:
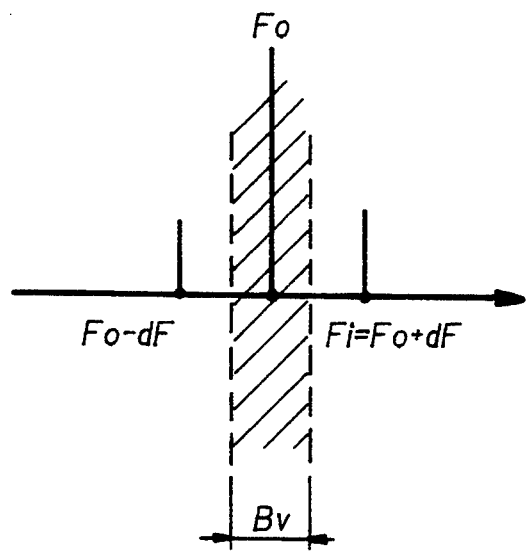
FIG. 2 shows the distribution of the frequencies.

This arrangement of various frequencies is shown in FIG. 2, where it is possible to see the natural frequency of the laser Fo and the beat frequencies at Fo−dF and Fo+dF, where dF=Fi−Fo. The locking band to be avoided is the hached band of width Bv.

When this condition is respected, a four wave mixture is obtained in the laser and the laser emits light at the frequencies Fo, Fo+dF and Fo−dF. The fields at the frequencies Fo+dF and Fo−dF are optically amplified by a four wave mixing process, as described by H. NAKAJIMA and R. FREY in an article entitled "Intracavity nearly degenerate four-wave mixing in a (GaAl)As semiconductor laser", published in Appl. Phys. Lett., 47, pp. 769–771, 1985.

Figure 3:
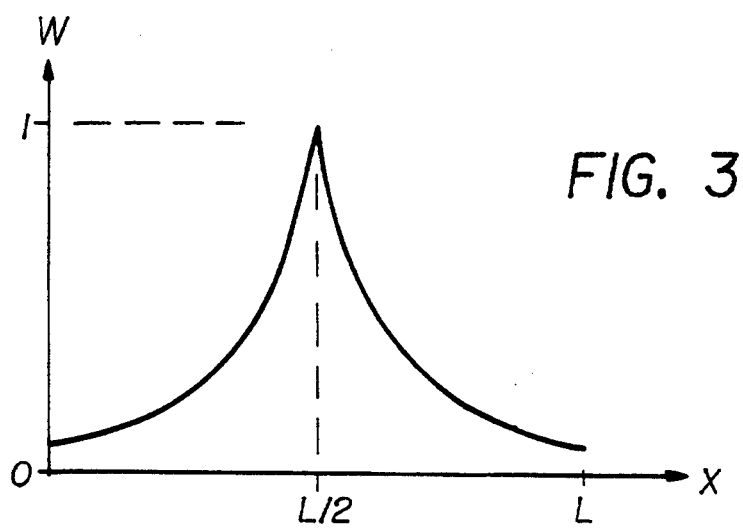
FIG. 3 shows the variations of the optical power along the active layer.

The detection by the central electrode 30 is made more effective than in a photodiode, because in a phase shift DFB laser the optical power tends to concentrate in the centre of the structure and this phenomenon is illustrated in FIG. 3. It is possible to see the optical power W (in arbitrary units) as a function of the distance X along the active layer. The laser cavity is assumed to have a length L. A very marked maximum occurs in the central zone of abscissa L/2.

FIG. 3 corresponds to a coefficient KL of approximately 4, in which K is the coupling coefficient of the grating with the active layer and L the laser cavity length.

Figure 4A:
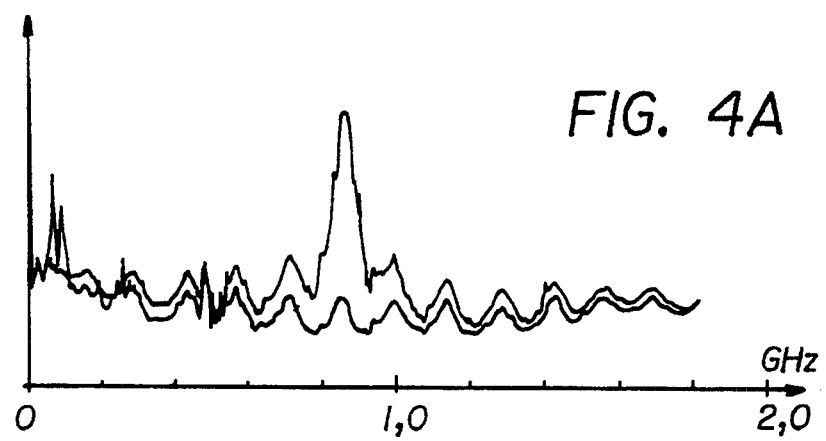
FIG. 4 shows the configuration of the detected heterodyne signal as a function of the frequency difference for a non-keyed signal (a) and for a FSK signal (b).
Figure 4B:
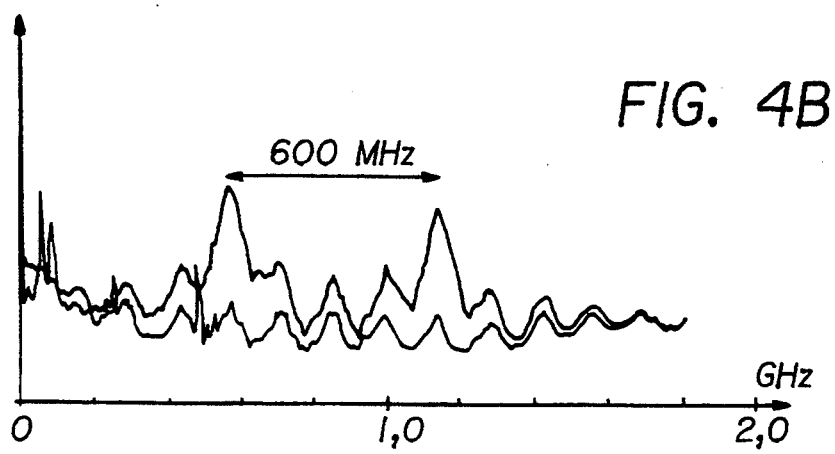

FIG. 4 shows the heterodyne signals as a function of the frequency difference (dF) for a nonkeyed signal (part a) and a FSK keyed signal (part b). In FIG. 4, the frequency variation appears on the abscissa and varies from 0 to 2 GHz. Therefore this division is 200 MHz. The frequency variation dF is approximately 800 MHz (FIG. a). FSK corresponds to 200 Mbit/s and the frequency excursion is 600 MHz. In FIG. 4b, it is possible to see two peaks corresponding to a logic "1" and "0" separated by 600 MHz.

One of the features of the invention is the presence, below the voltage tapping electrode, of a phase shifter, which can be of known type. Various constructional embodiments are described in the literature and in particular in the following articles:

K. SEKARTEDJO et al, "1.5 μm phase-shifted DFB lasers for single-mode operation", Electron. Lett., 20, pp. 80–81, 1984.

M. GILLERON et al, "1.5 μm phase shifted distributed feedback laser", J. Physique, Conference C4, Supplement to no. 9, vol. 49, September 1988.

T. MATSUYAMA et al, "TM mode suppression property of DFB lasers with a narrow stripe region", IEEE Photonics Techn. Lett. 2, pp. 612–613, 1990.

Figure 5A:
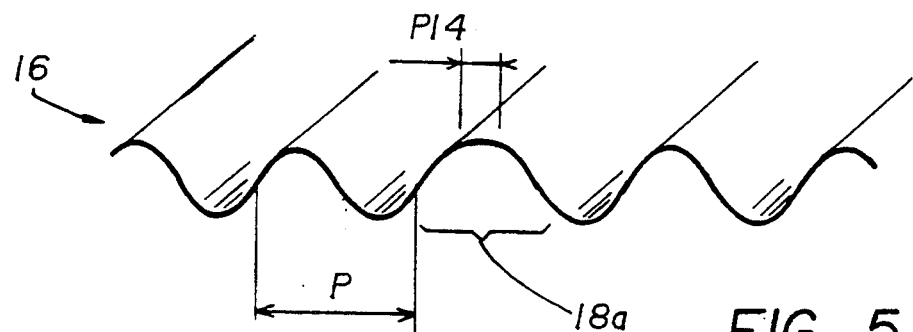
FIG. 5 shows embodiments of a phase shifter.
Figure 5B:
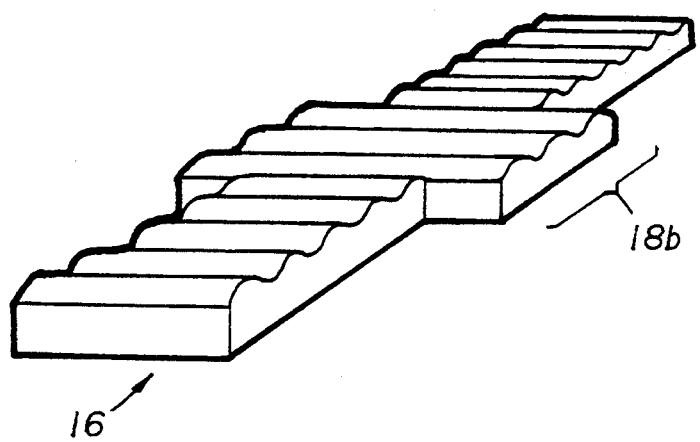
Figure 5C:
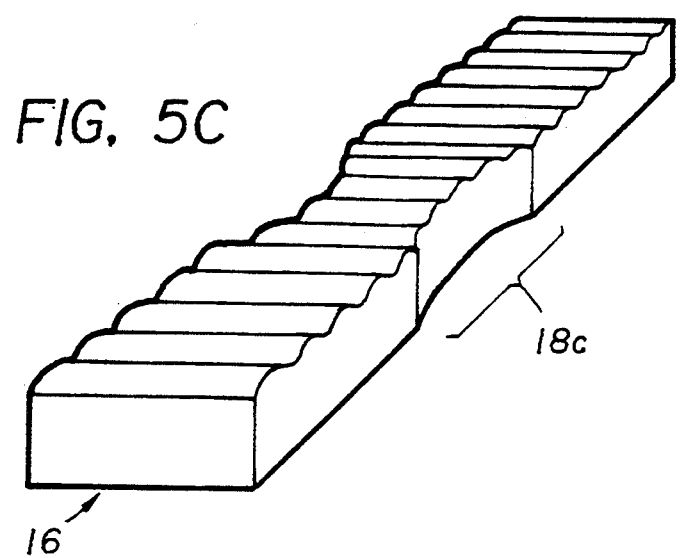

Three examples of phase shifters are illustrated in FIG. 5, but it is obvious that they in no way limit the scope of the invention.

In part a, it is possible to see a diffraction grating 16 with its surface having a periodic undulation or ripple of spacing p. In the central area 18a, said spacing is extended by a quarter spacing (p/4), which introduces a quarter wavelength optical phase shift for a wave passing along the grating in one or other direction. It would naturally also be possible to shorten the grating by a quarter spacing.

In part b it is possible to see a grating 16 having a regular spacing, but with a widened portion in the central area 18b. The length of the widened portion corresponds to a quarter wavelength optical phase shift. In part c, the grating has a contracted area 18c.

All these phase shifters can be used in the invention.

Any known process can be used for producing the structure according to the invention. It is e.g. possible to use the so-called buried ridge strike method. Such a method is described in the article by J. CHARIL et al entitled "Extremely low threshold operation of 1.5 μm GaInAsP/InP buried ridge stripe lasers", published in Electron. Lett., 25, pp. 1477–1479, 1989.

Figure 6A:
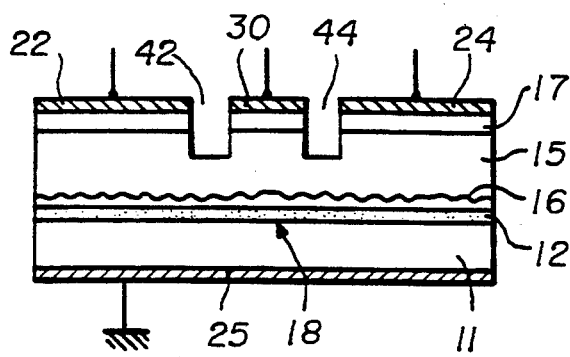
FIG. 6 shows a detail of the semiconductor structure.
Figure 6B:
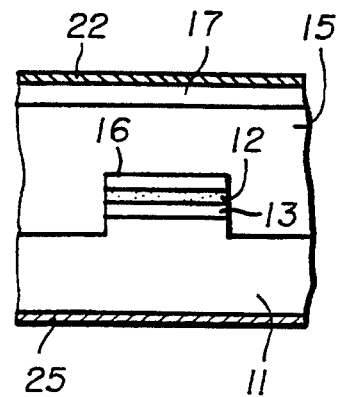

This embodiment, which in no way restricts the invention, is illustrated in FIG. 6, in longitudinal section (a) and in cross-section (b). It is possible to see the elements already shown in FIG. 1 and which carry the same references, namely the active layer 12, the grating 16, the lateral electrodes 22, 24, the lower electrode 25 and the central electrode 30. It is also possible to see that the electrodes 22, 24 on the one hand and 30 on the other are separated by two grooves 42, 44 obtained by etching. In part (b) it is possible to see that the active layer 12 is located in a buried stripe in a layer 15. The active layer 12 can rest on a confinement layer 13, which in turn rests on a substrate 11. Finally, a highly doped semiconductor layer 17 is placed between the upper electrode 22, 24, 30 and the layer 15.

For example, the active layer 12 can be produced by a stack of layers constituting a multiple quantum well of MQW structure centred on the wavelength 1.5 μm. The substrate can be of N-doped InP, the confinement layer 13 can be centred on the wavelength of 1.3 μm, as well as the layer 15, everything being P+-doped InP. The layer 17 can be P-doped InP.

Figure 7:
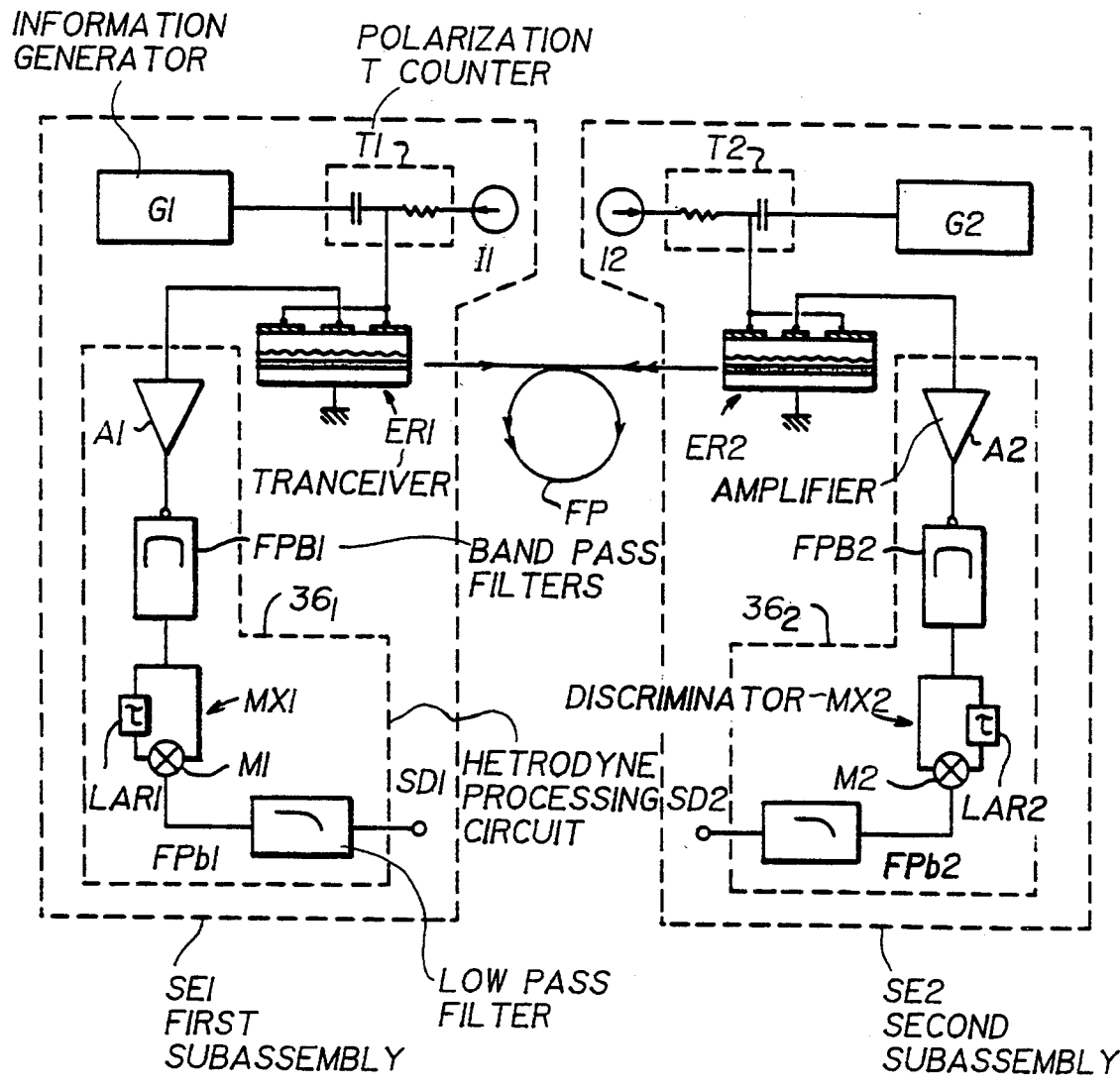
FIG. 7 illustrates a bidirectional link using two transceivers according to the invention.

The present invention also relates to a bi-directional optical link, which is shown in FIG. 7. It has a first subassembly SE1, an optical fibre FO and a second subassembly SE2. These two subassemblies are identical and have the same means designated by a letter followed by a subscript 1 for the first and a subscript 2 for the second.

The first subassembly SE1 comprises a transceiver ER1 according to FIG. 1 and a heterodyne processing circuit $36_1$ connected to the central voltage tapping electrode. A power supply I1 is connected to the lateral supply electrodes across a polarization T coupler T1 constituted by a capacitor and an inductance coil. An information generator G1 is able to modulate the laser current in order to modulate its transmission frequency. The intensity of the current supplied by I1 is regulated above the laser threshold.

The circuit $36_1$ comprises an amplifier A1, a band pass filter FPB1 making it possible to extract the useful part from the signal, a discriminator MX1 with a delay line LAR1, a multiplier M1 and a low pass filter FPb1. The demodulation signal appears on the output SD1. The configuration of the system of FIG. 7 is perfectly symmetrical.

To obtain a stable operation, it is also possible to use an intermediate frequency stabilization circuit. In view of the fact that this circuit is, like the others, a heterodyne circuit, it was not previously described.

I claim:

1. A coherent optical signal transceiver, comprising;
   a distributed feedback semiconductor structure, comprising an active layer extending along a propagation direction between first and second active layer ends,
   a diffraction grating disposed above the active layer, the diffraction grating extending in the propagation direction between first and second diffraction grating ends, the diffraction grating having a first region adjacent its first end and a second region adjacent its second end, the first and second regions having a first periodicity, the diffraction grating having a central region that is between the first and second regions having a second periodicity, the periodicities in the first, second, and central regions of the diffraction grating are selected such that the first and second regions are out of phase by a selected phase shift, the diffraction grating opposing at least a portion of the active layer;
   a first electrode that is above the first region of the diffraction grating;
   a second electrode that is above the second region of the diffraction grating;
   a central electrode that is above the central region of the diffraction grating:
   current supply means connected to the first and second electrodes for supplying current to the first and second electrodes;
   a processing circuit connected to the central electrode comprising means for detecting a signal upon the central electrode.

2. A transceiver according to claim 1, wherein the active layer comprises a quantum well structure.

3. A transceiver according to claim 1, wherein the first periodicity is less than the second periodicity.

4. A transceiver according to claim 1, wherein the first periodicity is greater than the second periodicity.

5. A transceiver according to claim 1, wherein the processing circuit comprises a heterodyne processing circuit.

6. A transceiver according to claim 5, wherein the heterodyne processing circuit comprises a high frequency amplifier, a band pass filter having its input connected to an output of the high frequency amplifier, a frequency discriminator having its input connected to an output of the band pass filter, and a low pass filter having its input connected to an output of the frequency discriminator.

7. A bidirectional optical link, comprising:
   a first transceiver;
   a second transceiver;
   an optical transmission line connected between the first and second transceivers; and
   wherein each of the first and second transceivers comprise a distributed feedback semiconductor structure, comprising
   an active layer extending along a propagation direction between first and second active layer ends,
   a diffraction grating disposed above the active layer, the diffraction grating extending in the propagation direction between first and second diffraction grating ends, the diffraction grating having a first region adjacent its first end and a second region adjacent its second end, the first and second regions having a first periodicity, the diffraction grating having a central region that is between the first and second regions having a second periodicity, the periodicities in the first, second, and central regions of the diffraction grating are selected such that the first and second regions are out of phase by a selected phase shift, the diffraction grating opposing at least a portion of the active layer,
   a first electrode that is above the first region of the diffraction grating,
   a second electrode that is above the second region of the diffraction grating, and
   a central electrode that is above the central region of the diffraction grating.

8. A distributed feedback semiconductor laser structure, comprising:
   an active layer extending along a propagation direction between first and second active layer ends;
   a diffraction grating disposed above the active layer, the diffraction grating extending in the propagation direction between first and second diffraction grating ends, the diffraction grating having a first region adjacent its first end and a second region adjacent its second end, the first and second regions having a first periodicity, the diffraction grating having a central region that is between the first and second regions having a second periodicity, the periodicities in the first, second, and central regions of the diffraction grating are selected such that the first and second regions are out of phase by a selected phase shift, the diffraction grating opposing at least a portion of the active layer;
   a first electrode that is above the first region of the diffraction grating;
   a second electrode that is above the second region of the diffraction grating; and
   a central electrode that is above the central region of the diffraction grating.

9. A structure according to claim 8, wherein the diffraction grating spans a same length along the propagation direction as the active layer.

10. A structure according to claim 9, wherein the central electrode is spatially separated from the first and second electrodes.

* * * * *